US008344757B2

United States Patent
Matano

(10) Patent No.: US 8,344,757 B2
(45) Date of Patent: Jan. 1, 2013

(54) SEMICONDUCTOR DEVICE AND DATA PROCESSING SYSTEM INCLUDING THE SAME

(75) Inventor: Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/986,681

(22) Filed: Jan. 7, 2011

(65) Prior Publication Data

US 2011/0175644 A1  Jul. 21, 2011

(30) Foreign Application Priority Data

Jan. 15, 2010 (JP) ................................ 2010-007500

(51) Int. Cl.
*H03K 19/094* (2006.01)
*H03K 19/0175* (2006.01)
(52) U.S. Cl. ........................... 326/83; 326/82; 326/81
(58) Field of Classification Search .................. None
See application file for complete search history.

(56) References Cited

U.S. PATENT DOCUMENTS

| 4,103,184 | A  | * | 7/1978  | Suzuki et al. ............... 377/121 |
| 4,945,262 | A  | * | 7/1990  | Piasecki .......................... 326/68 |
| 6,175,251 | B1 | * | 1/2001  | Horiguchi et al. ........... 326/83 |
| 6,989,686 | B2 | * | 1/2006  | Arakawa ........................ 326/21 |
| 7,268,589 | B2 | * | 9/2007  | Lee et al. ....................... 326/93 |
| 7,292,061 | B2 | * | 11/2007 | Oh ................................. 326/33 |
| 7,436,201 | B2 | * | 10/2008 | Kumar .......................... 326/27 |
| 7,532,035 | B2 | * | 5/2009  | Lee et al. ....................... 326/86 |
| 2001/0003418 | A1 | * | 6/2001 | Fujita et al. ............... 324/76.54 |
| 2004/0208046 | A1 |   | 10/2004 | Yokozeki |
| 2007/0075743 | A1 | * | 4/2007 | Oh ................................. 326/83 |

FOREIGN PATENT DOCUMENTS

| JP | 5-347550     | 12/1993 |
| JP | 8-227580     | 9/1996 |
| JP | 10-242840    | 9/1998 |
| JP | 2000-82950   | 3/2000 |
| JP | 2004-248143  | 9/2004 |

OTHER PUBLICATIONS

Office Action mailed Feb. 21, 2012, directed to Korean Application No. 10-2011-0004275; 4 pages.

* cited by examiner

*Primary Examiner* — Shawki Ismail
*Assistant Examiner* — Crystal L Hammond
(74) *Attorney, Agent, or Firm* — Morrison & Foerster LLP

(57) ABSTRACT

A semiconductor device includes a first circuit block connected between first and second power lines, a logic circuit that receives an output signal of the first circuit block that is connected between the first power line and a fourth power line or a third power line and the second power line, and a second circuit block that receives an output signal of the logic circuit that is connected between the third and fourth power lines. In an active state, a first potential is supplied and in a standby state, a second potential lower than the first potential is supplied between the first and second power lines. In any of the active state and the standby state, the first potential is supplied between the third and fourth power lines. With this configuration, speeding-up of a critical path can be realized while maintaining a subthreshold current low.

26 Claims, 10 Drawing Sheets

SEMICONDUCTOR DEVICE AND DATA PROCESSING SYSTEM INCLUDING THE SAME

BACKGROUND OF THE INVENTION

1. Field of the Invention

The present invention relates to a semiconductor device and a data processing system including the same, and more particularly relates to a semiconductor device capable of reducing its power consumption in the standby state and a data processing system including the semiconductor device.

2. Description of Related Art

In recent years, an operation voltage of semiconductor devices is steadily reduced for reducing their power consumption. Some of currently available semiconductor devices have an operation voltage as low as 1 V. However, a threshold voltage of a transistor needs to be reduced following the reduction in the operation voltage, and this fact leads to a problem that a subthreshold current of the transistor in a non-conductive state is increased. As a solution to this problem, a power gating control method in which power lines are separated into main power lines and dummy power lines has been proposed in Japanese Patent Application Laid-open Nos. H05-347550, 2000-82950, and H08-227580.

In a semiconductor device disclosed in Japanese Patent Application Laid-open No. H05-347550, there is disclosed a technique in which all power nodes of a circuit block to be subjected to a power gating control are connected to dummy power lines. Furthermore, when the circuit block is in an active mode, the same voltage as that of the main power line is supplied to the circuit block by short circuiting the main power lines and the dummy power lines, and when the circuit block is in a standby mode, a lower voltage than that of the main power line is supplied to the circuit block by connecting the main power lines and the dummy power lines via a resistor. Consequently, in the active mode, a signal having a desired amplitude is transmitted through the circuit block, and because the voltage between a source and a drain of a transistor that is turned off is lower in the standby mode than in the active mode, a subthreshold current can be reduced.

However, in the semiconductor device disclosed in Japanese Patent Application Laid-open No. H05-347550, as shown in FIG. 11 thereof, a level converting circuit that amplifies an amplitude of an output signal is required at a later stage of the circuit block. This is because a level of the output signal in the standby mode differs from that in the active mode. If the output signal is not amplified, there is an increased leakage current in an input unit (an input initial stage) of the circuit block of the next stage that is not subjected to the power gating control. Assuming that an electric potential that indicates a high level in the active mode is VDD, and an electric potential that indicates a high level in the standby mode is VDDT (<VDD), if a threshold value of a P-channel MOS transistor that constitutes the input initial stage of the circuit block of the next stage that is not subjected to the power gating control is VDD−VDDT or less, the P-channel MOS transistor of the input initial stage, which needs to be turned off, is in fact turned on, and a through current disadvantageously flows. Therefore, in the semiconductor device disclosed in Japanese Patent Application Laid-open No. H05-347550, the level converting circuit needs to be connected at the later stage of the circuit block that is subjected to the power gating control. Thus, when there are several circuit blocks that are subjected to the power gating control and are not subjected to the power gating control, as many level converting circuits are required, leading to an increased circuit size. In addition, signal delays are caused due to the increased number of logical steps due to the level converting circuits.

Meanwhile, Japanese Patent Application Laid-open Nos. 2000-82950 and H08-227580 disclose a technique in which, among logic circuits constituting the circuit block that is subjected to power gating control, a power node on a high side is connected to a main power line and a power node on a low side is connected to a dummy power line for a logic circuit that needs to output a high level at the time of standby, and a power node on a high side is connected to a dummy power line and a power node on a low side is connected to a main power line for a logic circuit that needs to output a low level at the time of standby. According to this technique, because a source of a transistor that is turned off in a standby mode is invariably connected to a dummy power line, by disconnecting a dummy power line from a main power line at the time of standby, almost no subthreshold current flows of the transistor that is turned off.

However, in the semiconductor device disclosed in Japanese Patent Application Laid-open Nos. 2000-82950 and H08-227580, every power node of each logic circuit needs to be connected to either the main power line or the dummy power line according to a logic level fixed (static) at the time of standby. Consequently, the wiring structure becomes complex (requiring connecting each of the plurality of logic gates alternately to two different power lines (power nodes)). Furthermore, even when a slight alteration in a design (such as, an alteration of the number of stages of the logic gate) is required, there can be cases where connection destinations of the power nodes in several logic circuits have to be changed, making alterations in design a time-consuming task.

SUMMARY

In one embodiment, there is provided a semiconductor device that includes: a first power line of high potential side and a second power line of low potential side that are power gated; a third power line of high potential side and a fourth power line of low potential side that are not power gated; and first to third logic circuits, respectively, including an input node to receive an input signal and an output node to output an output signal, wherein the first logic circuit is connected to the first power line and the second power line, the second logic circuit is connected to the first and fourth power lines or the third and second power lines, the third logic circuit is connected to the third power line and the fourth power line, and the output node of the first logic circuit is connected to the input node of the second logic circuit, and the output node of the second logic circuit is connected to the input node of the third logic circuit.

In another embodiment, there is provided a semiconductor device comprising: first and third power lines supplied with an electric potential showing a logical high level, respectively; second and fourth power lines supplied with an electric potential showing a logical low level, respectively; a first off-leakage control circuit that supplies the first power line with an electric potential that is same as an electric potential of the third power line in a first state, and supplies the first power line with an electric potential that is lower than the electric potential of the third power line in a second state; a second off-leakage control circuit that supplies the second power line with an electric potential that is same as an electric potential of the fourth power line in the first state, and supplies the second power line with an electric potential that is higher than the electric potential of the fourth power line in the second state; a first circuit block including a power node on a high potential side connected to the first power line and a power node on a low potential side connected to the second power line; a second circuit block including a power node on a high potential side is connected to the third power line and a power node on a low potential side connected to the fourth power line; and a logic circuit including an input connected to an output node of the first circuit block and an output node connected to an input node of the second circuit block, wherein the logic circuit, in the first state, dynamically supplies the input node of the second circuit block with a signal of the logical high level via the third power line or a signal of the logical low level via the second power line, or, dynamically supplies the input node of the second circuit block with a signal of the logical high level via the first power line or a signal of the logical low level via the fourth power line, based on an output signal output from the output node of the first circuit block, and the logic circuit, in the second state, fixedly supplies the input node of the second circuit block with the signal of the logical high level via the third power line, or fixedly supplies to the input node of the second circuit block with the signal of the logical low level via the fourth power line based on an output signal output from the output node of the first circuit block.

In still another embodiment, there is provided a semiconductor device comprising: first, second, and third logic circuits, wherein the first logic circuit includes a first input node and a first output node and includes a first transistor of a first conductivity type that becomes electrically conducting when an output signal to be output to the first output node is a high level and a second transistor of a second conductivity type that becomes electrically conducting when the output signal to be output to the first output node is a low level, the second logic circuit includes a second input node that receives the output signal of the first output node and a second output node, and includes a third transistor of the first conductivity type that becomes electrically conducting when an output signal to be output to the second output node is a high level and a fourth transistor of the second conductivity type that becomes electrically conducting when the output signal to be output to the second output node is a low level, the third logic circuit includes a third input node that receives the output signal of the second output node and a third output node, and includes a fifth transistor of the first conductivity type that becomes electrically conducting when an output signal to be output to the third output node is a high level and a sixth transistor of the second conductivity type that becomes electrically conducting when the output signal to be output to the third output node to a low level, in a first state drains of ones of the first to sixth transistors that are in an electrically conductive state becomes a first potential when an output signal of a corresponding logic circuit is at a high level and becomes a second potential when an output signal of the corresponding logic circuit is at a low level, a voltage between sources and drains of ones of the first to sixth transistors that are in an electrically non-conductive state becomes a difference potential of the first potential and the second potential, in a second state a drain of one of the first and second transistors that is in an electrically conductive state becomes a third potential lower than the first potential when an output signal of the first logic circuit is at a high level and becomes a fourth potential higher than the second potential when an output signal of the first logic circuit is at a low level, a voltage between a source and a drain of one of the first and second transistors that is in an electrically non-conductive state becomes a difference potential of the third potential and the fourth potential, a drain of one of the third and fourth transistors that is in an electrically conductive state becomes the first potential when an output signal of the second logic circuit is at a high level and becomes the second potential when an output signal of the second logic circuit is at a low level, a voltage between a source and a drain of one of the third and fourth transistors that is in a non-conductive state becomes either a difference potential of the first potential and the fourth potential or a difference potential of the third potential and the second potential, a drain of one of the fifth and sixth transistors that is in an electrically conductive state becomes the first potential when an output signal of the third logic circuit is at a high level and becomes the second potential when an output signal of the third logic circuit is at a low level, and a voltage between a source and a drain of one of the fifth and sixth transistors that is in an electrically non-conductive state becomes a difference potential of the first potential and the second potential.

In one embodiment, there is provided a data processing system that includes: the semiconductor device; and a controller that supplies a command to the semiconductor device, wherein the semiconductor device enters in the first state or the second state based on the command.

According to the present invention, a second logic circuit that is subjected to power gating on either a high potential side or a low potential side is arranged between a first logic circuit that are subjected to power gating on both the high potential side and the low potential side, and a third logic circuit that are not subjected to power gating on either the high potential side or the low potential side. Thus, there is no need to arrange a level converting circuit between a circuit block that is subjected to a power gating control and a circuit block that is not subjected to a power gating control without complicating a power supply wiring structure of the first logic circuits. Thus, simplification of a circuit configuration is achieved. In addition, because any signal delay is not caused by the level converting circuit, a critical path speed can be increased while maintaining a reduced subthreshold current.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, in the present invention, a second logic circuit in which either one of a high potential side and a low potential side is power gated is arranged between a first logic circuit in which both the high potential side and the low potential side are power gated, and a third logic circuit in which neither of the high potential side and the low potential side is power gated. In other words, to explain the technical concept of the present invention, in a circuit block that is subjected to a power gating control, logic circuits are differentiated into a last stage logic circuit and logic circuits other than the last stage logic circuit. In the logic circuits other than the last stage logic circuit, power nodes are connected to dummy power lines on a high side as well as on a low side. In the last stage logic circuit, one power node is connected to a main power line, while the other power node is connected to the dummy power line, based on a logic level of an input signal (which is an output signal output by the logic circuits other than the last stage logic circuit from signal output terminals thereof) that is static in a standby mode and that is input from a signal input terminal of the last stage logic circuit. For example, when the logic level is High (electric potential of the dummy power line on the high potential side), the power node on the high potential side is connected to the dummy power line (dummy power line on the high potential side), and the power node on the low potential side is connected to the main power line (main power line on the low potential side). When the logic level is Low (electric potential of the dummy power line on the low potential side), the power node on the low potential side is connected to the dummy power line (dummy power line on the low potential side), and the power node on the high potential side is connected to the main power line (main power line on the high potential side). Thus, because the output signal of the last stage logic circuit is supplied from the main power line even in the standby mode, the circuit block can be connected to a next stage circuit block that is not subjected to a power gating control without having to arrange a level converting circuit therebetween.

Preferred embodiments of the present invention will be explained below in detail with reference to the accompanying drawings.

Figure 1:
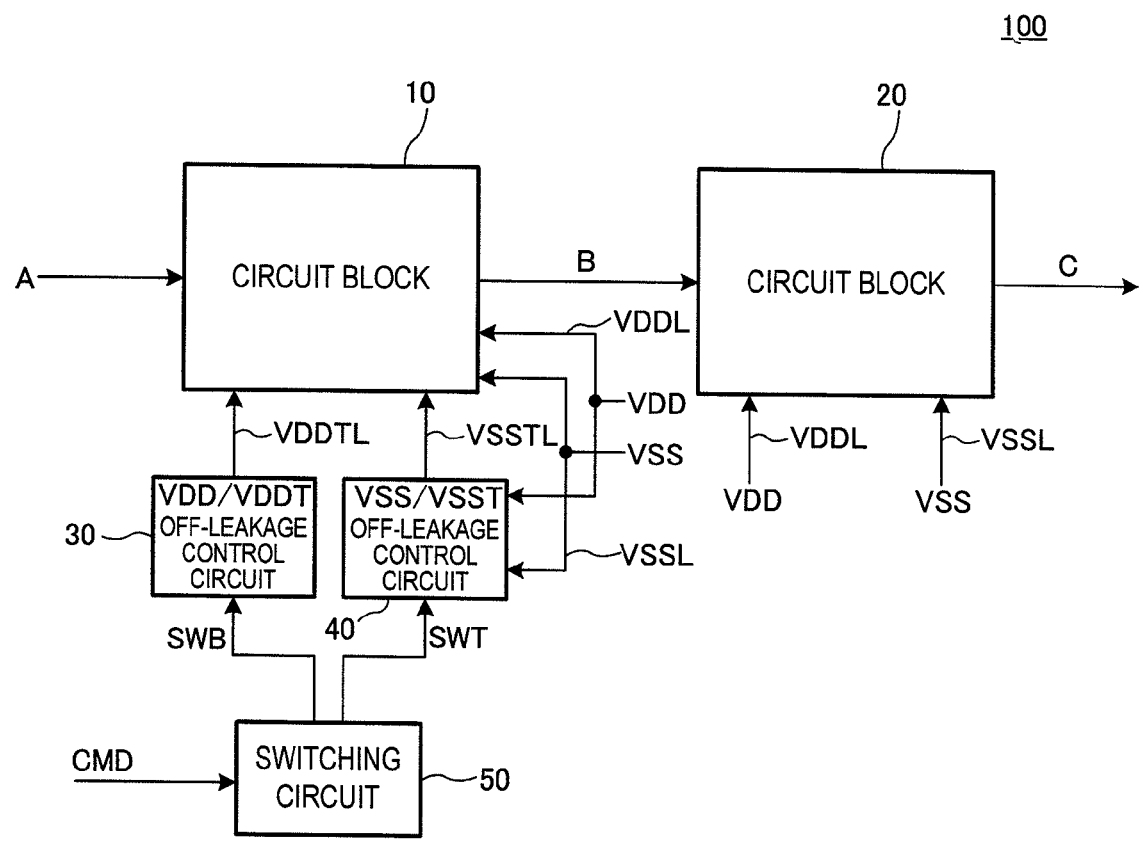
FIG. 1 is a block diagram of a configuration of a semiconductor device according to an embodiment of the present invention.

FIG. 1 is a block diagram of a configuration of a semiconductor device according to an embodiment of the present invention.

As shown in FIG. 1, a semiconductor device 100 according to the present embodiment includes a first circuit block 10 that receives a signal A and outputs a signal B, and a second circuit block 20 that receives the signal B and outputs a signal C. The circuit block 10 is a circuit block that is subjected to a power gating control whereas the circuit block 20 is a circuit block that is not subjected to a power gating control. The power gating control is control in which a subthreshold current is reduced while maintaining a logical state by transmitting a signal having a desired amplitude by receiving an operation voltage of the circuit block from the main power line in an active mode (first state) where the signal A can change, and by receiving a power voltage of the circuit block from the dummy power line in the standby mode (second state) where the signal A is fixed. The present embodiment is designed such that the logic level of the signal B in the standby mode, as an example, fixed to a high level. The circuit blocks 10 and 20 are only a part of circuits included in the semiconductor device 100.

The circuit block 10 that is subjected to the power gating control is a circuit block that includes transistors that have a relatively fast switching speed. Transistors that have a relatively low threshold voltage should be preferably used for increasing the switching speed. Because the transistors having a low threshold voltage have a large subthreshold current, the effect of power reduction by the implementation of the power gating control becomes more prominent in such transistors. The circuit block 20 that is not subjected to a power gating control, on the other hand, is a circuit block that includes transistors that have a relatively slow switching speed. Because the transistors that have a relatively slow switching speed have a high threshold voltage, the subthreshold current is small.

The threshold voltage of the transistor can be adjusted by adjusting a film thickness of a gate insulation film, a channel length (a distance between a source and a drain of the transistor, and the same direction as a direction of the current flowing in an inversion channel), a dopant density of the channel or the like. For example, the threshold voltage can be reduced by reducing the thickness of the gate insulation film, reducing the channel length or the like.

As shown in FIG. 1, a power potential VDD on the high potential side is supplied via a main power line VDDL (third power line), and a power potential VSS on the low potential side is supplied via a main power line VSSL (fourth power line) to the circuit blocks 10 and 20. The power potentials VDD and VSS are potentials that are supplied, for example, from external power sources, and therefore are always maintained at predetermined values when the semiconductor device 100 is powered on, regardless of whether the mode is active or standby. For example, the power potential VDD=1.2 V, and the power potential VSS=0 V. In addition to the power potentials VDD and VSS, a power potential VDDT (<VDD) on the high potential side is supplied via a dummy power line VDDTL (first power line) and a power potential VSST (>VSS) on the low potential side is supplied via a dummy power line VSSTL (second power line) to the circuit block 10. The power potential VDDT on the high potential side is supplied by a first off-leakage control circuit 30. Similarly, the power potential VSST on the low potential side is supplied by a second off-leakage control circuit 40. For example, the power potential VDDT is approximately equal to 1.0 V and the power potential VSST is approximately equal to 0.2 V. The power potentials VDD and VDDT are potentials that indicate a high logic level, whereas the power potentials VSS and VSST are potentials that indicate a low logic level. Meanwhile, the high side here means a high potential side and low side means a low potential side.

The off-leakage control circuits 30 and 40 are circuits that are controlled by switching signals SWB and SWT, respectively, supplied from a switching circuit 50. The switching signals SWB and SWT are complementary signals. When a command signal CMD supplied to the semiconductor device 100 from outside shows an active mode, the switching circuit 50 outputs a low level switching signal SWB and a high level switching signal SWT. Consequently, the off-leakage control circuits 30 and 40 are activated. When the off-leakage control circuits 30 and 40 are active, the off-leakage control circuit 30 sets an electric potential to be supplied to the dummy power line VDDTL to VDD, and the off-leakage control circuit 40 sets an electric potential to be supplied to the dummy power line VSSTL to VSS. That is, VDDTL=VDD and VSSTL=VSS. Thus, a voltage between the dummy power lines VDDTL and VSSTL is VDD−VSS (first voltage).

On the other hand, when the command signal CMD shows a standby mode, the switching circuit 50 outputs a high level switching signal SWB and a low level switching signal SWT. Consequently, the off-leakage control circuits 30 and 40 are inactivated. When the off-leakage control circuits 30 and 40 are inactive, the off-leakage control circuit 30 sets an electric potential to be supplied to the dummy power line VDDTL to VDDT, and the off-leakage control circuit 40 sets an electric potential to be supplied to the dummy power line VSSTL to VSST. That is, VDDTL<VDD, and VSSTL>VSS. Thus, a voltage between the dummy power lines VDDTL and VSSTL is VDDT−VSST (second voltage). Therefore, the first voltage is greater than the second voltage.

Figure 2A:
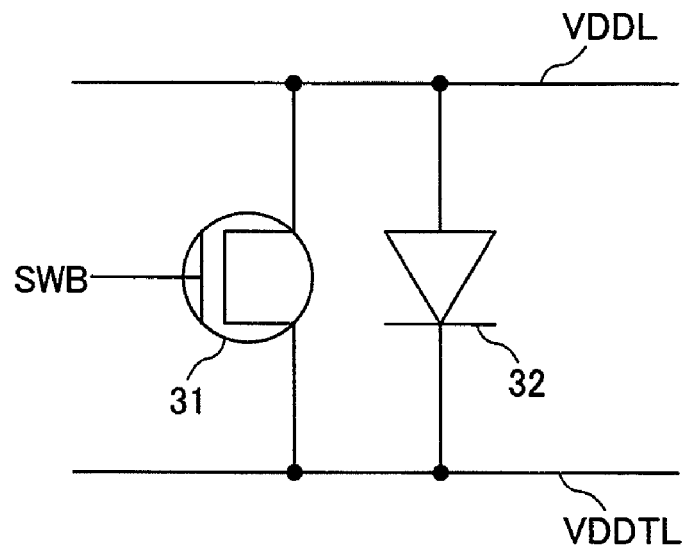
FIG. 2A is a circuit diagram of an off-leakage control circuit 30.
Figure 2B:
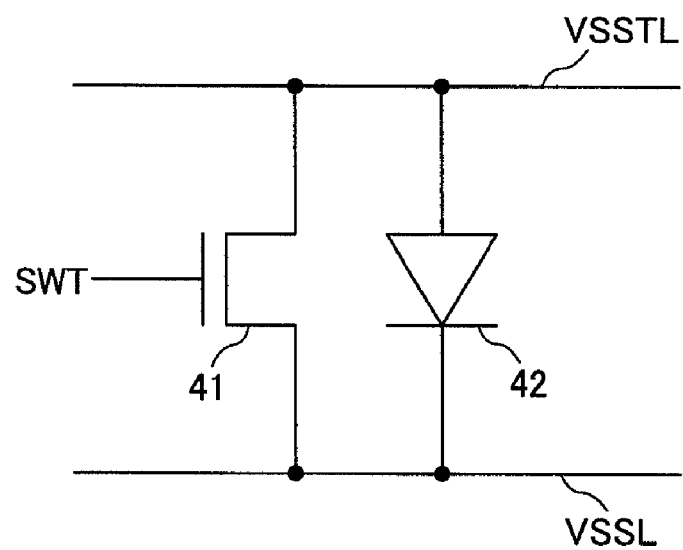
FIG. 2B is a circuit diagram of an off-leakage control circuit 40.

FIG. 2A is a circuit diagram of the off-leakage control circuit 30, and FIG. 2B is a circuit diagram of the off-leakage control circuit 40.

As shown in FIG. 2A, the off-leakage control circuit 30 includes a P-channel MOS transistor 31 (first switch circuit) and a diode 32 (first step-down circuit) that are parallel connected between the main power line VDDL and the dummy power line VDDTL. The switching signal SWB is supplied to a gate electrode of the transistor 31. Consequently, when the switching signal SWB is activated to a low level (indicating active mode), the main power line VDDL and the dummy power line VDDTL are short-circuited by the transistor 31. As a result, the electric potential VDD of the main power line VDDL is applied to the dummy power line VDDTL. On the other hand, when the switching signal SWB is inactivated to a high level (indicating standby mode), because the transistor 31 becomes electrically non-conductive, the main power line VDDL and the dummy power line VDDTL are connected through the diode 32. An anode of the diode 32 is connected to the main power line VDDL and a cathode is connected to the dummy power line VDDTL. Therefore, when the transistor 31 is turned off, the power potential VDDT equivalent to the power potential VDD minus a threshold voltage of the diode 32 is supplied to the dummy power line VDDTL. That is, assuming the threshold voltage of the diode 32 to be Vt, VDDT=VDD−Vt.

As shown in FIG. 2B, the off-leakage control circuit 40 includes an N-channel MOS transistor 41 (second switch circuit) and a diode 42 (second step-down circuit) that are parallel connected between the main power line VSSL and the dummy power line VSSTL. The switching signal SWT is supplied to a gate electrode of the transistor 41. Consequently, when the switching signal SWT that indicates an active mode is activated to a high level, the main power line VSSL and the dummy power line VSSTL are short-circuited by the transistor 41. As a result, the electric potential VSS of the main power line VSSL is applied to the dummy power line VSSTL. On the other hand, when the switching signal SWT that indicates a standby mode is inactivated to a low level, because the transistor 41 becomes electrically non-conductive, the main power line VSSL and the dummy power line VSSTL are connected through the diode 42. An anode of the diode 42 is connected to the dummy power line VSSTL and a cathode is connected to the main power line VSSL. Therefore, when the transistor 41 is turned off, the power potential VSST equivalent to the power potential VSS plus a threshold voltage of the diode 42 is supplied to the dummy power line VSSTL. That is, assuming the threshold voltage of the diode 42 to be Vt, VSST=VSS+Vt.

Figure 3:
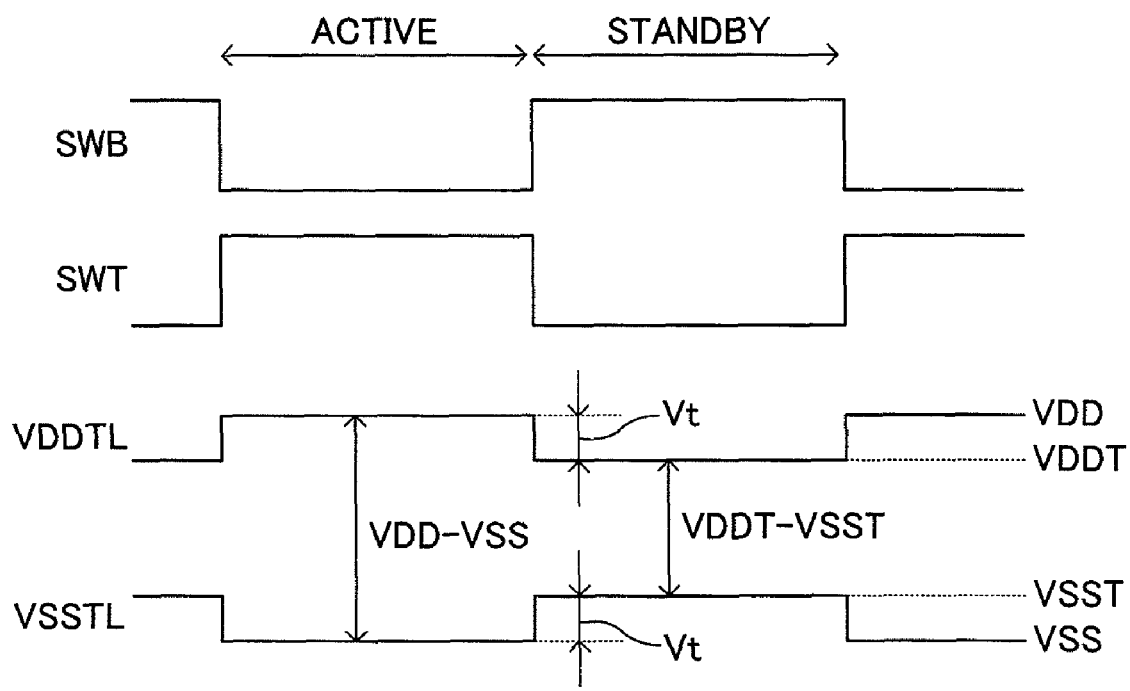
FIG. 3 is a timing chart of the off-leakage control circuits 30 and 40.

FIG. 3 is a timing chart of the off-leakage control circuits 30 and 40.

As shown in FIG. 3, in the active mode, because the switching signals SWB and SWT are at a low level and a high level, respectively, the electric potential of the dummy power line VDDTL becomes the power potential VDD, and the electric potential of the dummy power line VSSTL becomes the power potential VSS. On the other hand, in the standby mode, because the switching signals SWB and SWT are at a high level and at a low level, respectively, the electric potential of the dummy power line VDDTL drops to the power potential VDDT and the electric potential of the dummy power line VSSTL rises to the power potential VSST.

Figure 4:
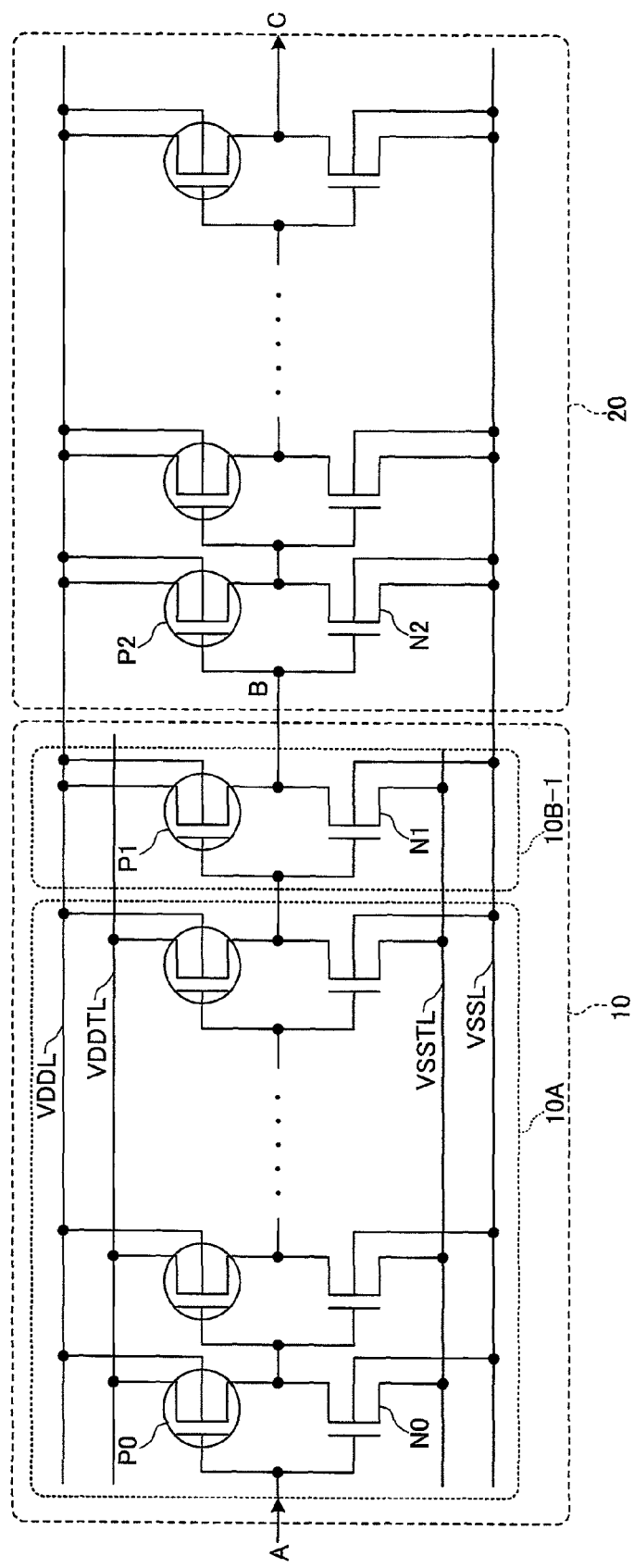
FIG. 4 is a circuit diagram showing an example of circuit blocks 10 and 20.

FIG. 4 is a circuit diagram of the circuit blocks 10 and 20.

As shown in FIG. 4, the circuit block 10 includes a circuit block 10A (first logic circuits) and a last stage logic circuit 10B-1 (second logic circuit). In the example of FIG. 4, the circuit block 10A and the logic circuit 10B-1 are shown as inverter chains; however, the circuit configuration is not limited thereto. As long as the circuit block 10A and the logic circuit 10B-1 are cascade connected, other circuit configurations such as a NAND and NOR and so on can be also used.

As shown in FIG. 4, power nodes on the high potential side (first power nodes) of the logic circuits constituting the circuit block 10A are connected to the dummy power line VDDTL, and power nodes on the low potential side (second power nodes) are connected to the dummy power line VSSTL. In this case, the power node on the high potential side and the power node on the low potential side indicate, respectively, a source of a P-channel MOS transistor P0 and a source of an N-channel MOS transistor N0 constituting each inverter. Accordingly, the logic circuits constituting the circuit block 10A have a voltage between the power potentials VDD and VSS as the operation potential in the active mode, and a voltage between the power potentials VDDT and VSST as the operation potential in the standby mode. As a result, when the mode switches to the standby mode, there is a reduction in a voltage between the source and the drain of the transistors that are electrically non-conductive, and consequently, the subthreshold current is reduced.

Furthermore, of the transistors constituting the circuit block 10A, a substrate of the P-channel MOS transistor P0 is connected to the main power line VDDL, and a substrate of the N-channel MOS transistor N0 is connected to the main power line VSSL. When the mode switches to the standby mode, a substrate potential of each transistor remains unaltered even when there is a reduction in the operation potential of the circuit block 10A. Consequently, when the mode switches to the standby mode, there is a rise in a voltage between the substrate and the source, and there is a further reduction in the subthreshold current due to a substrate bias effect. Furthermore, a sub-leakage current flowing between the drain and the substrate is reduced due to the reduction in the voltage between the drain and the substrate. In addition, a gate leakage current is reduced due to the reduction in the voltage between a gate and an inversion layer.

On the other hand, a power node on the high potential side (third power node) of the logic circuit 10B-1 is connected to the main power line VDDL, and a power node on the low potential side (fourth power node) is connected to the dummy power line VSSTL. In this case, the power node on the high potential side and the power node on the low potential side indicate, respectively, a source of a P-channel MOS transistor P1 constituting an inverter and a source of an N-channel MOS transistor N1 constituting the inverter. Consequently, in the active mode, the same potential that is applied to the power nodes in the circuit block 10A is applied to the pair of power nodes. However, unlike in the circuit block 10A, application of the power potential VDD on a source (power node) of the P-channel MOS transistor P1 is continued even when the mode is switched to the standby mode. The reason why connection is made in this manner only in the logic circuit 10B-1 of a last stage is because the present embodiment is designed such that the logic level of the signal B in the standby mode is fixed to a high level. That is, in the present embodiment, because the P-channel MOS transistor P1 invariably becomes electrically conductive in the standby mode, by connecting the source thereof, which is the power node, not to the dummy power line VDDTL, but to the main power line VDDL the electric potential of the signal B at the time of standby can be brought to the level of the power potential VDD. Consequently, a through current of a P-channel MOS transistor P2, which is an initial stage member of the circuit block 20, can be prevented. Furthermore, in the last stage logic circuit 10B-1, because the power node on the low potential side (fourth power node) is connected to the dummy power line VSSTL, the subthreshold current in the N-channel MOS transistor N1 is reduced. Consequently, the logic circuit 10B-1 not only prevents the through current in the circuit block 20 without the aid of the level converting circuit, but also reduces its own subthreshold current.

In this manner, the logic circuit 10B-1 dynamically supplies a signal of a potential level of the power potential VDD via the main power line VDDL or a signal of a potential level of the power potential VSS via the dummy power line VSSTL to the circuit block 20, based on the output signal from the circuit block 10A in the active mode, whereas fixedly (statically) supplies the signal of a potential level of the power potential VDD via the main power line VDDL to the circuit block 20, based on the output signal from the circuit block 10A in the standby mode. Dynamic here means an electric operation such as, an operation of switching logic levels between High and Low. Static (or fixed) also means an electric operation, not a permanent physical state, but an operation of maintaining, for example, any one of a High state and a Low state. These technical definitions apply throughout the present specification.

As shown in FIG. 4, power nodes on the high potential side (fifth power nodes) of the logic circuits constituting the circuit block 20 (third logic circuits) are connected to the main power line VDDL, and power nodes on the low potential side (sixth power nodes) are connected to the main power line VSSL. In the example of FIG. 4, the circuit block 20 is shown as an inverter chain; however, the circuit configuration is not limited thereto as long as the circuit blocks 10 and 20 are cascade connected. In this case, the power node on the high potential side and the power node on the low potential side indicate, respectively, a source of a P-channel MOS transistor P2 constituting each inverter and a source of an N-channel MOS transistor N2 constituting each inverter.

In this manner, in the circuit block 20, the power nodes of the logic circuits are all connected to the main power lines VDDL and VSSL, and not to the dummy power lines VDDTL and VSSTL. Consequently, even though the amplitude of the signal B supplied by the previous stage circuit block 10 still needs to be of the level of the power potential equivalent to VDD–VSS, there is no need for arranging the level converting circuit (voltage level converting circuit) between the circuit blocks 10 and 20 for preventing a through current. This is because, in the present invention, the level of the signal B dynamically swings between the power potentials VDD and VSS in the active mode but is static at the level of the power potential VDD in the standby mode. Therefore, not only is the circuit configuration simplified, but also an increased critical path speed can be realized because any signal delay is not caused by the level converting circuit.

Figure 5:
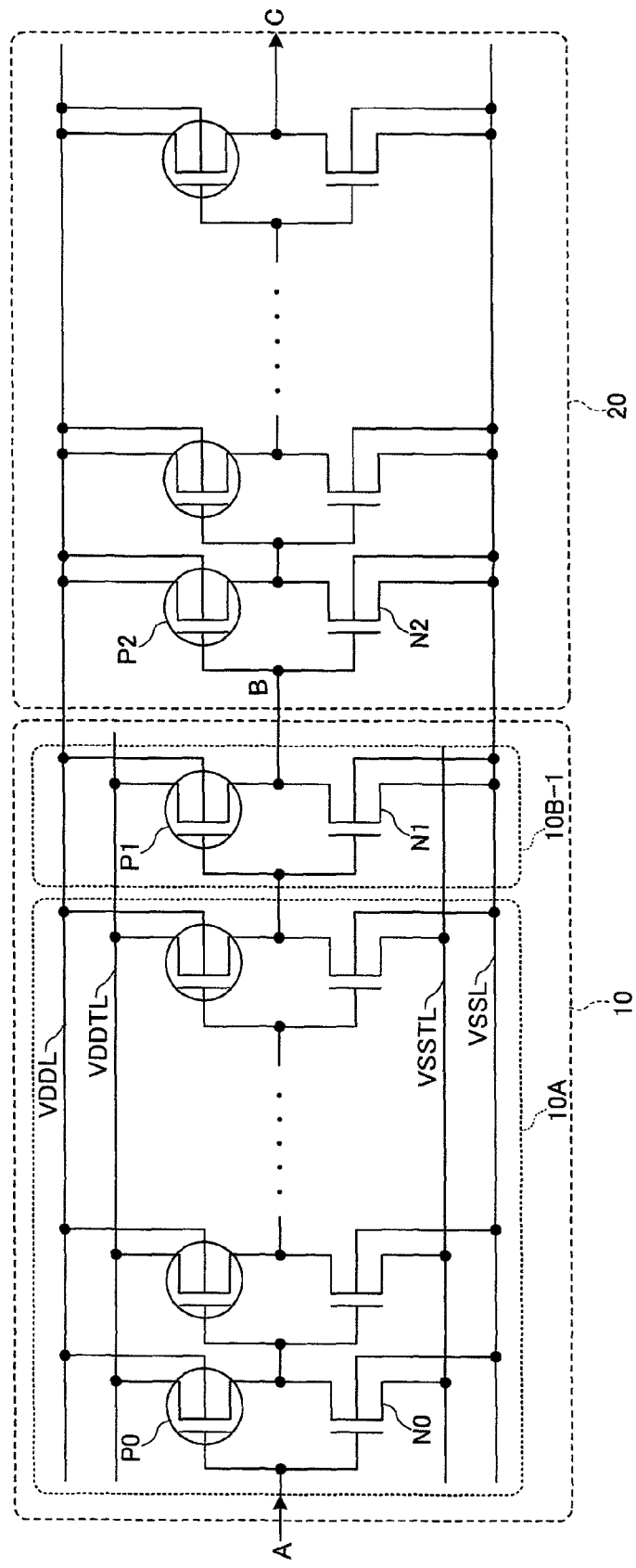
FIG. 5 is a circuit diagram showing another example of circuit blocks 10 and 20.

While a case where the signal B is fixed to a high level in the standby mode is explained with reference to FIG. 4, it is needless to mention that the present invention is not limited thereto. As shown in FIG. 5, in a case where the signal B is fixed to a low level, a logic circuit 10B-2 can be used instead of the logic circuit 10B-1. In the logic circuit 10B-2, a power node on the high potential side is connected to the dummy power line VDDTL, and a power node on the low potential side is connected to the main power line VSSL. Due to this, because the N-channel MOS transistor N1 invariably becomes electrically conductive in the standby mode, the signal B attains a potential level of the power potential VSS and not of the power potential VSST.

Figure 6:
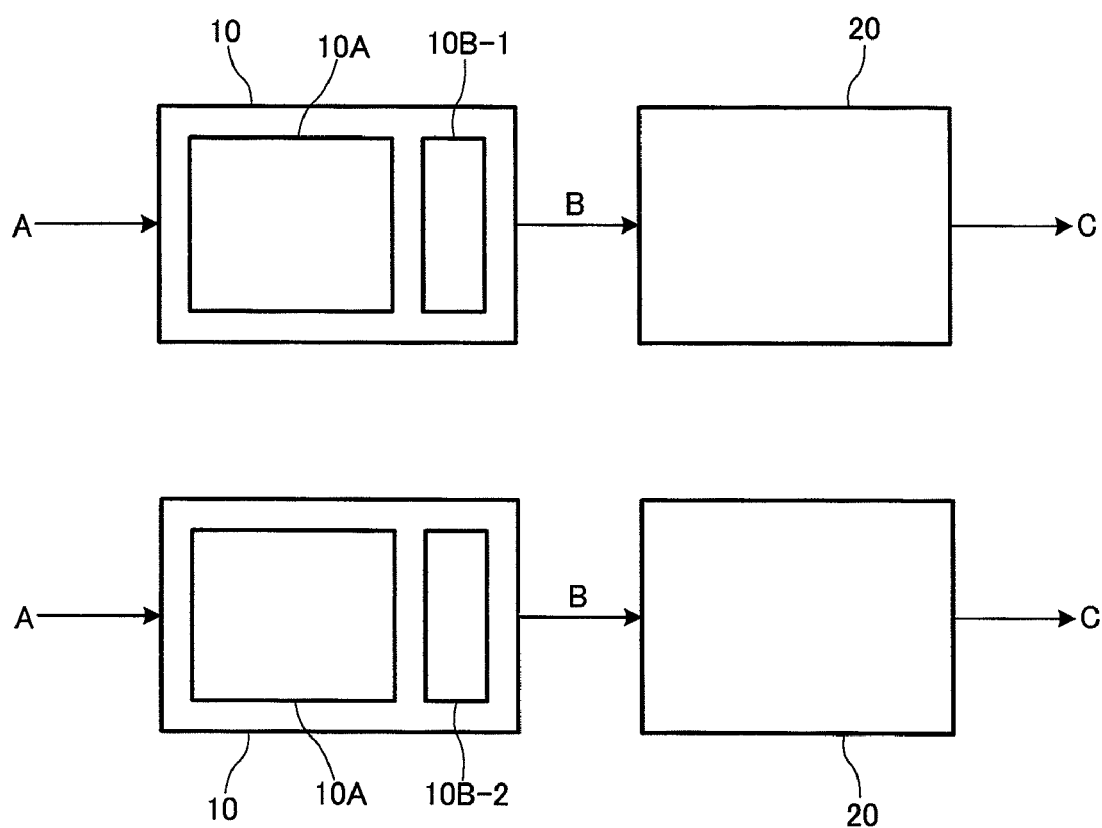
FIG. 6 is a block diagram showing an example where both a logic circuit 10B-1 and a logic circuit 10*b*-2 are used.

Needless to mention, because an actual semiconductor device includes a large number of circuit blocks, as shown in FIG. 6, a mixture of the circuit blocks 10 that include the logic circuit 10B-1 and the circuit blocks 10 that include the logic circuit 10B-2 can be used for implementing power gating control on a plurality of circuit blocks.

Figure 7A:
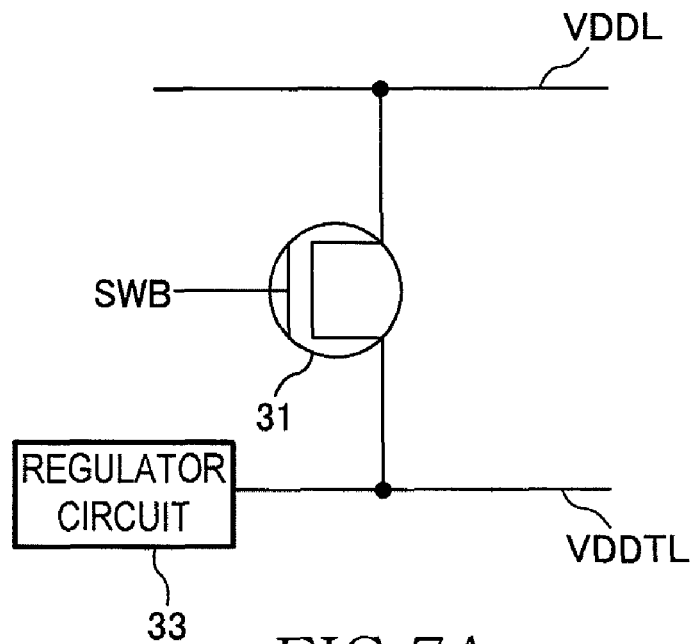
FIG. 7A is a circuit diagram of the off-leakage control circuit 30 of another example.
Figure 7B:
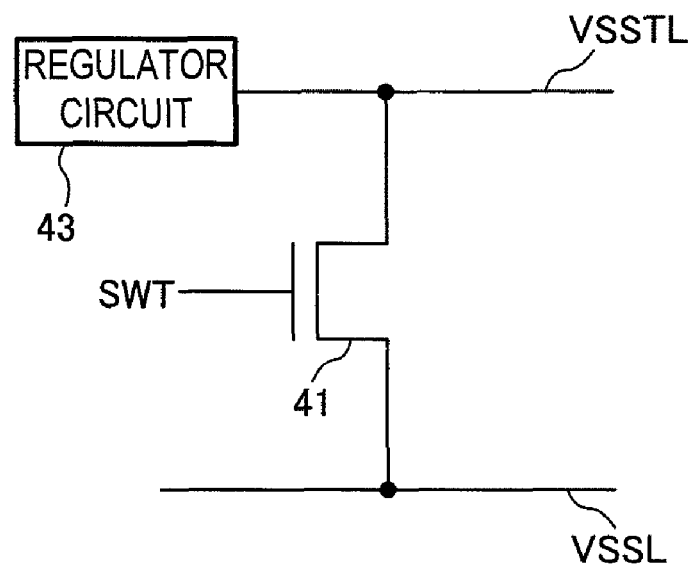
FIG. 7B is a circuit diagram of the off-leakage control circuit 40 of another example.

FIG. 7A is a circuit diagram of the off-leakage control circuit 30 of another example, and FIG. 7B is a circuit diagram of the off-leakage control circuit 40 of another example.

The off-leakage control circuit 30 of FIG. 7A includes the P-channel MOS transistor 31 that is connected between the main power line VDDL and the dummy power line VDDTL, and a regulator circuit 33 (first regulator circuit) that is connected to the dummy power line VDDTL. It differs from the off-leakage control circuit 30 of FIG. 2A in that it does not include the diode 32.

Figure 8A:
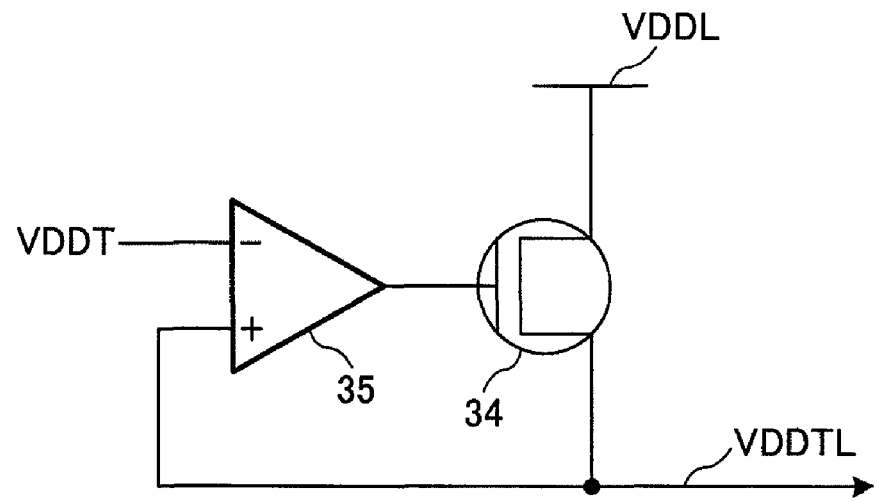
FIG. 8A is a circuit diagram of a regulator circuit 33.

FIG. 8A is a circuit diagram of the regulator circuit 33. As shown in FIG. 8A, the regulator circuit 33 includes a P-channel MOS transistor 34 that is connected between the main power line VDDL and the dummy power line VDDTL, and an operational amplifier 35 whose output terminal is connected to a gate electrode of the transistor 34. The power potential VDDT is supplied to an inverting input terminal (−) of the operational amplifier 35, and a non-inverting input terminal (+) is connected to the dummy power line VDDTL. Therefore, when the power potential VDDT is input into the inverting input terminal (−) of the operational amplifier 35 when the transistor 31 is turned off, the power potential VDDT appears in the dummy power line VDDTL. The power potential VDDT supplied to the inverting input terminal (−) is an electric potential that determines the electric potential of the dummy power line VDDTL, and is set to a predetermined electric potential so as to minimize the leakage current. The inverting input terminal is an input node of the regulator circuit 33, and exerts control over the electric potential of the dummy power line VDDTL according to the predetermined electric potential that the inverting input terminal itself receives.

The off-leakage control circuit 40 of FIG. 7B includes the N-channel MOS transistor 41 that is connected between the dummy power line VSSTL and the main power line VSSL, and a regulator circuit 43 (second regulator circuit) connected to the dummy power line VSSTL. It differs from the off-leakage control circuit 40 of FIG. 2B in that it does not include the diode 42.

Figure 8B:
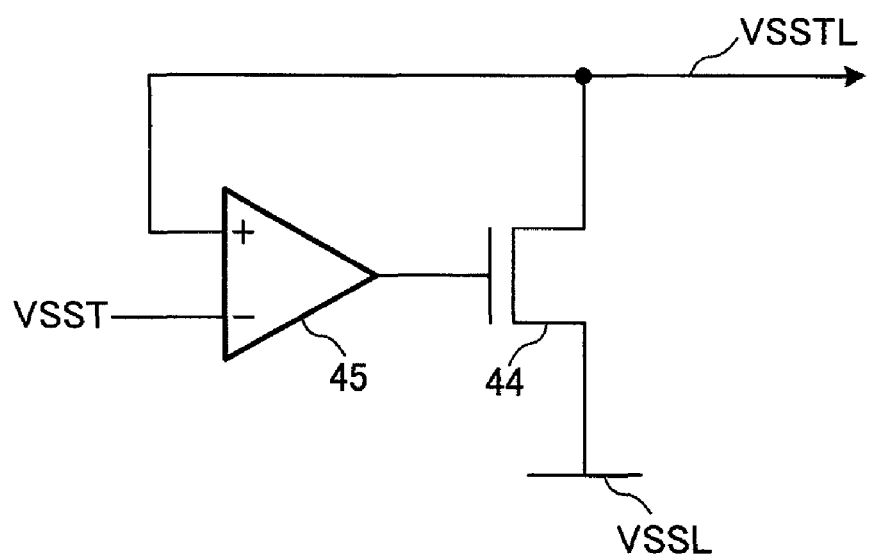
FIG. 8B is a circuit diagram of a regulator circuit 43.

FIG. 8B is a circuit diagram of the regulator circuit 43. As shown in FIG. 8B, the regulator circuit 43 includes an N-channel MOS transistor 44 that is connected between the dummy power line VSSTL and the main power line VSSL, and an operational amplifier 45 whose output terminal is connected to a gate electrode of the transistor 44. The power potential VSST is supplied to an inverting input terminal (−) of the operational amplifier 45, and a non-inverting input terminal (+) is connected to the dummy power line VSSTL. Therefore, when the power potential VSST is input into the inverting input terminal (−) of the operational amplifier 45 when the transistor 41 is turned off, the power potential VSST appears in the dummy power line VSSTL. The power potential VSST supplied to the inverting input terminal (−) is an electric potential that determines the electric potential of the dummy power line VSSTL, and is set to a predetermined electric potential so as to minimize the leakage current. The inverting input terminal is an input node of the regulator circuit 43, and exerts control over the electric potential of the dummy power line VSSTL according to the predetermined electric potential that the inverting input terminal itself receives.

As described above, in the off-leakage control circuits 30 and 40 of FIGS. 7A and 7B, the electric potential levels of the dummy power lines VDDTL and VSSTL at the time of standby can be minutely adjusted by the regulator circuits 33 and 43. As a result, reduction of the subthreshold current can be optimized. Furthermore, the levels of the power potentials VDDT and VSST can be dynamically altered depending on temperature conditions, processing conditions, manufacturing variation and the like.

Figure 9A:
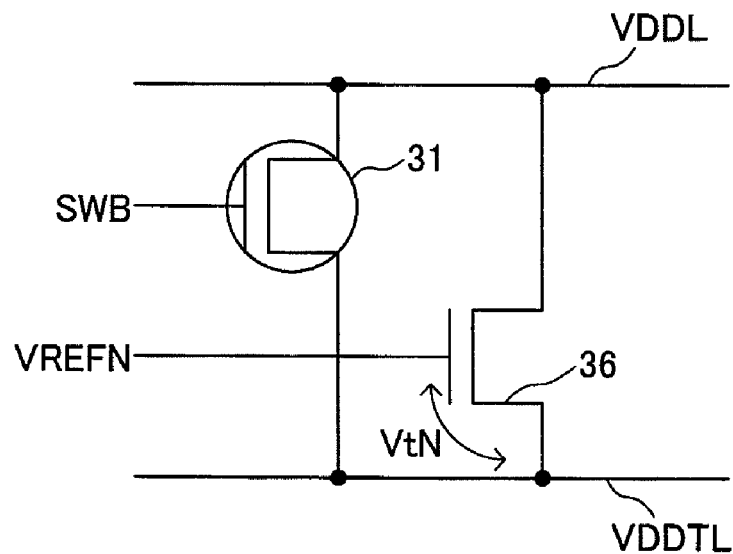
FIG. 9A is a circuit diagram of the off-leakage control circuit 30 of still another example.
Figure 9B:
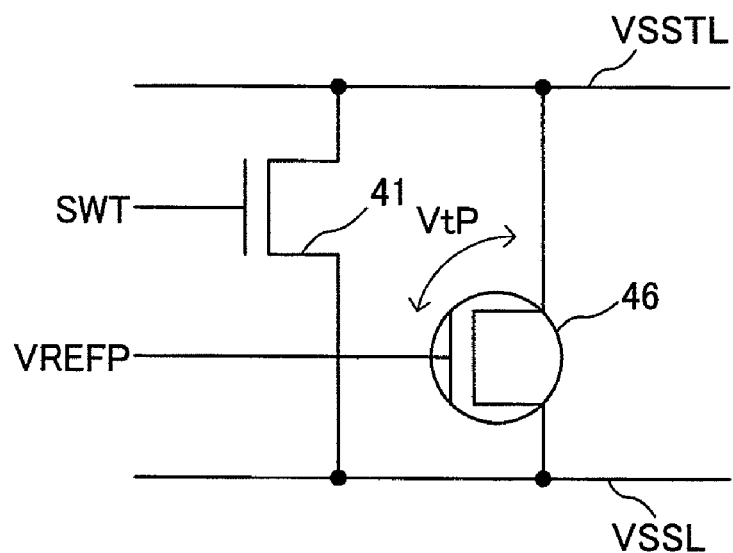
FIG. 9B is a circuit diagram of the off-leakage control circuit 40 of still another example.

FIG. 9A is a circuit diagram of the off-leakage control circuit 30 of still another example, and FIG. 9B is a circuit diagram of the off-leakage control circuit 40 of still another example.

The off-leakage control circuit 30 of FIG. 9A includes the P-channel MOS transistor 31 and an N-channel MOS transistor 36 (first transistor switch) that are parallel connected between the main power line VDDL and the dummy power line VDDTL. A reference potential VREFN is supplied to a gate electrode of the transistor 36. Therefore, when the transistor 31 is turned off, that is, in the standby mode, assuming that a threshold voltage of the transistor 36 is VtN, an electric potential equivalent to VREFN−VtN appears in the dummy power line VDDTL. The electric potential supplied to the dummy power line VDDTL can be adjusted by adjusting the reference potential VREFN.

Similarly, the off-leakage control circuit 40 of FIG. 9B includes the N-channel MOS transistor 41 and a P-channel MOS transistor 46 (second transistor switch) that are parallel connected between the dummy power line VSSTL and the main power line VSSL. A reference potential VREFP is supplied to a gate electrode of the transistor 46. Due to this, even when the transistor 41 is turned off, that is, in the standby mode, assuming that a threshold voltage of the transistor 46 is VtP, an electric potential equivalent to VREFP+VtP appears in the dummy power line VSSTL. The electric potential supplied to the dummy power line VSSTL can be adjusted by adjusting the reference potential VREFP.

Thus, in the off-leakage control circuits 30 and 40 of FIGS. 9A and 9B also, the electric potential levels of the dummy power lines VDDTL and VSSTL at the time of standby can be minutely adjusted by the N-channel MOS transistor 36 and the P-channel MOS transistor 46. As a result, reduction of the subthreshold current can be optimized. Furthermore, the levels of the power potentials VDDT and VSST can be dynamically altered depending on temperature conditions, processing conditions, manufacturing variation or the like.

Figure 10:
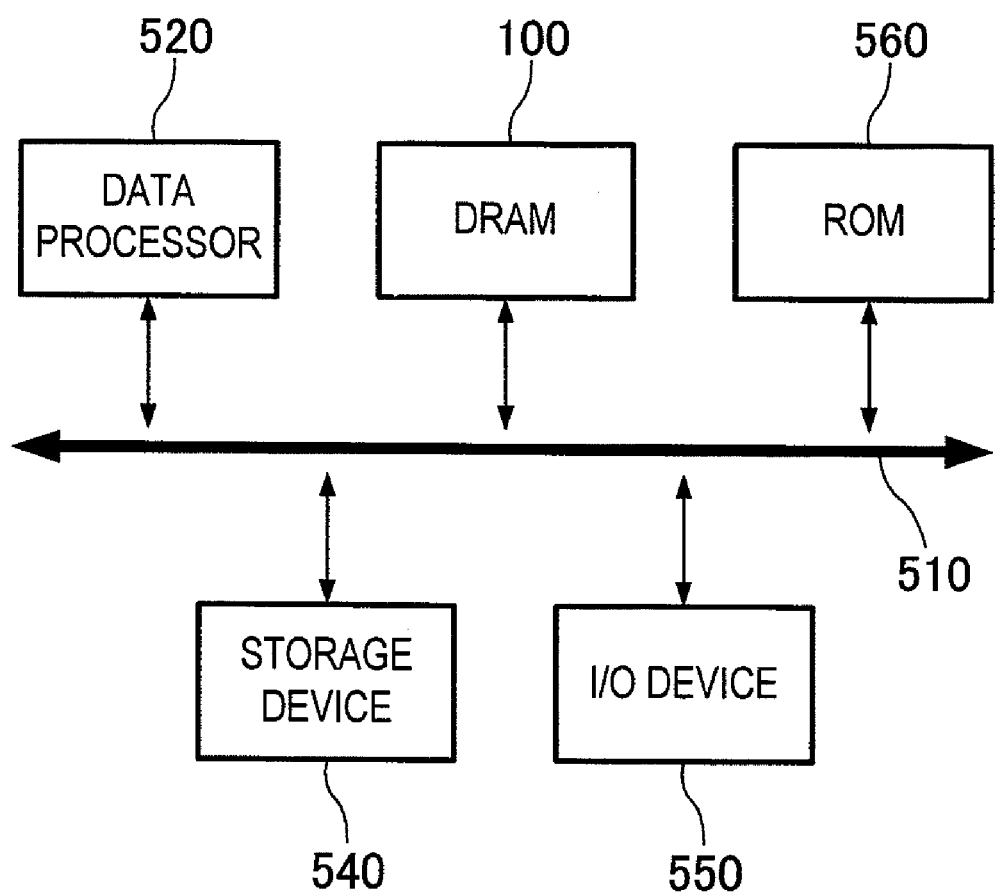
FIG. 10 is a block diagram showing a configuration of a data processing system 500 using the semiconductor device 100 according to the embodiment of the present invention.

FIG. 10 is a block diagram showing the configuration of a data processing system 500 using the semiconductor device 100 according to this embodiment.

The data processing system 500 shown in FIG. 10 has a configuration in which a data processor 520 and the semiconductor device (DRAM) 100 according to this embodiment are mutually connected via a system bus 510. The data processor 520, for example, includes micro-processor (MPU) or digital signal processor (DSP). But it is not limited to them. In FIG. 10, for the sake of shorthand, the data processor 520 and the DRAM 100 are connected via the system bus 510. But they may be connected using a local bus not via the system bus 510.

In FIG. 10, for the sake of shorthand, only one set of the system bus 510 is drawn. But a plurality of system buses 510 may be provided in serial or parallel manner via some connectors etc., if needed. In the data processing system 500 shown in FIG. 10, a storage device 540, I/O device 550, and ROM 560 are also connected to the system bus 510. But these components are not indispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to. The I/O device 550 can be only one of the input device and the output device.

Though only one component is drawn for each of the components shown in FIG. 10, the number of each of the components is not limited to one. The data processing system 500 can include a plurality of each of the components.

In the embodiment of the present invention, a controller (for example, the data processor 520), which controls a DRAM, issues various commands to the DRAM 100. The DRAM 100 switches to the active mode or the standby mode based on these commands. The plurality of commands issued by the controller are commands (system commands), which are defined by a known trade organization (JEDEC (Joint Electron Device Engineering Council) Solid State Technology Association) controlling semiconductor devices.

It is apparent that the present invention is not limited to the above embodiments, but may be modified and changed without departing from the scope and spirit of the invention.

The basic technical concept of the present application can be applied to, for example, transmission route of control signals of the critical path that determine external access, data signals of a memory or a data processor and the like. Furthermore, the circuit configurations of the circuit blocks, the logic circuits, the off-leakage control circuits, switch circuits, and other circuits that generate control signals are not limited to those disclosed in the embodiment described above.

Generally, the active mode (first state) indicates a period when the semiconductor device 100 is accessed from outside. Conversely, the standby mode (second state) indicates when the semiconductor device 100 is not accessed from outside even though power is supplied to the semiconductor device 100 from outside. The semiconductor device 100 may be provided with a refresh function that is executed at predetermined time intervals to retain information stored in volatile memory cells such as a DRAM (Dynamic Random Access Memory). The semiconductor device 100 may be further provided with a self refresh function by which the refresh operation is performed asynchronously with the outside by an internal timer provided inside the semiconductor device 100. When the self refresh function is active, a system in which the semiconductor device 100 is installed is in the standby mode; however, due to the self refresh operation performed intermittently by the timer inside the semiconductor device 100, the semiconductor device 100 repeatedly switches between the standby mode (defined as a standby 1 mode) and the active mode (the refresh operation). In the present application, the standby 1 mode during the self refresh operation is also included in the second state.

The basic technical concept of the present invention can be applied to various semiconductor devices. That is, the present invention can be applied to general semiconductor devices, such as a CPU (Central Processing Unit), an MCU (Micro Control Unit), a DSP (Digital Signal Processor), an ASIC (Application Specific Integrated Circuit), an ASSP (Application Specific Standard Circuit), or a memory. As shown in FIG. 10, the present invention can be applied to the data processor 520, the storage device 540, and the ROM 560. The production mode of semiconductor devices to which the present invention is applied includes an SOC (System on Chip), an MCP (Multi Chip Package), and a POP (Package on Package). The present invention can be applied to semiconductor devices including such a production mode or a packaging mode.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). As the transistor, other than FETS, various types of transistors such as a bipolar transistor can be also used. A bipolar transistor can be included in a part of the device.

In addition, a PMOS transistor (P-channel MOS transistor) is a representative example of a first conductive transistor, and an NMOS transistor (N-channel MOS transistor) is a representative example of a second conductive transistor.

Many combinations and selections of various constituent elements disclosed in this specification can be made within the scope of the appended claims of the present invention. That is, it is needless to mention that the present invention embraces the entire disclosure of this specification including the claims, as well as various changes and modifications which can be made by those skilled in the art based on the technical concept of the invention.

What is claimed is:

1. A semiconductor device comprising:
   a first power line of high potential side and a second power line of low potential side that are power gated;
   a third power line of high potential side and a fourth power line of low potential side that are not power gated; and
   first to third logic circuits each including an input node to receive an input signal and an output node to output an output signal, wherein
   the first logic circuit is connected to the first power line and the second power line,
   the second logic circuit is connected to the first and fourth power lines or the third and second power lines,
   the third logic circuit is connected to the third power line and the fourth power line,
   the output node of the first logic circuit is connected to the input node of the second logic circuit, and
   the output node of the second logic circuit is connected to the input node of the third logic circuit.

2. The semiconductor device as claimed in claim 1, wherein
   in a first state, an electric potential of the first power line and an electric potential of the second power line are equal to an electric potential of the third power line and an electric potential of the fourth power line, respectively, and
   in a second state, the electric potential of the first power line is lower than the electric potential of the third power line, the electric potential of the second power line is higher than the electric potential of the fourth power line, and the electric potential of the first power line is higher than the electric potential of the second power line.

3. The semiconductor device as claimed in claim 2, further comprising an off-leakage control circuit that supplies a first voltage between the first and second power lines in the first state and supplies a second voltage lower than the first voltage between the first and second power lines in the second state, wherein
   the first voltage is supplied between the third and fourth power lines in both the first state and the second state,
   the first logic circuit including first and second power nodes connected to the first and second power lines, respectively,
   the second logic circuit including third and fourth power nodes connected to either the first and fourth power lines or the third and second power lines, respectively, and
   the third logic circuit including fifth and sixth power nodes connected to the third and fourth power lines, respectively.

4. The semiconductor device as claimed in claim 3, wherein
   the output signal of the first logic circuit is fixed at a predetermined logic level in the second state, and
   the output signal of the first logic circuit is changeable in the first state.

5. The semiconductor device as claimed in claim 4, wherein
   the output signal of the first logic circuit is fixed at an electric potential applied to the first power line in the second state, and
   the third and fourth power nodes of the second logic circuit are connected to the first and fourth power lines, respectively.

6. The semiconductor device as claimed in claim 4, wherein
   the output signal of the first logic circuit is fixed at an electric potential applied to the second power line in the second state, and
   the third and fourth power nodes of the second logic circuit are connected to the third and second power lines, respectively.

7. The semiconductor device as claimed in claim 3, wherein threshold voltages of transistors included in the first and second logic circuits are lower than threshold voltages of transistors included in the third logic circuit.

8. The semiconductor device as claimed in claim 7, wherein thicknesses of gate insulation films of the transistors included in the first and second logic circuits are thinner than thicknesses of gate insulation films of the transistors included in the third logic circuit.

9. The semiconductor device as claimed in claim 7, wherein channel lengths between sources and drains of the transistors included in the first and second logic circuits are shorter than channel lengths between sources and drains of the transistors included in the third logic circuit.

10. The semiconductor device as claimed in claim 3, wherein
    the off-leakage control circuit includes a first switch circuit connected between the first and third power lines and a second switch circuit connected between the second and fourth power lines,
    both the first and second switch circuits are in an electrical conductive state in the first state, and
    both the first and second switch circuits are in an electrical non-conductive state in the second state.

11. The semiconductor device as claimed in claim 10, wherein the first switch circuit comprises an electric field effect transistor of a first conductivity type whose source is connected to the third power line and drain is connected to the first power line, and the second switch circuit comprises an electric field effect transistor of a second conductivity type whose source is connected to the fourth power line and drain is connected to the second power line.

12. The semiconductor device as claimed in claim 10, wherein the off-leakage control circuit includes a first step-down circuit connected between the first and third power lines and a second step-down circuit connected between the second and the fourth power lines.

13. The semiconductor device as claimed in claim 12, wherein the first and second step-down circuits comprise diodes, an anode of the diode constituting the first step-down circuit is connected to the third power line and a cathode is connected to the first power line, and an anode of the diode constituting the second step-down circuit is connected to the second power line and a cathode is connected to the fourth power line.

14. The semiconductor device as claimed in claim 10, wherein the off-leakage control circuit further includes a first regulator circuit that supplies a first potential to the first power line in the second state and a second regulator circuit that supplies a second potential to the second power line in the second state, the first regulator circuit controls the first potential based on a predetermined electric potential applied to its own input node, and the second regulator circuit controls the second potential based on a predetermined electric potential applied to its own input node.

15. The semiconductor device as claimed in claim 10, wherein the off-leakage control circuit further includes a first transistor switch having a source connected to the first power line, a drain connected to the third power line, and a gate supplied with a first control potential, and a second transistor switch having a source connected to the second power line, a drain connected to the fourth power line, and a gate supplied with a second control potential, and an electric potential of the first power line and an electric potential of the second power line are controlled based on the first and second control potentials, respectively.

16. The semiconductor device as claimed in claim 15, wherein conductivity types of an electric field effect transistor constituting the first switch circuit and an electric field effect transistor constituting the first transistor switch are mutually opposite, and conductivity types of an electric field effect transistor constituting the second switch circuit and an electric field effect transistor constituting the second transistor switch are mutually opposite.

17. A semiconductor device comprising:

first and third power lines supplied with an electric potential showing a logical high level, respectively;

second and fourth power lines supplied with an electric potential showing a logical low level, respectively;

a first off-leakage control circuit that supplies the first power line with an electric potential that is same as an electric potential of the third power line in a first state, and supplies the first power line with an electric potential that is lower than the electric potential of the third power line in a second state;

a second off-leakage control circuit that supplies the second power line with an electric potential that is same as an electric potential of the fourth power line in the first state, and supplies the second power line with an electric potential that is higher than the electric potential of the fourth power line in the second state;

a first circuit block including a power node on a high potential side connected to the first power line and a power node on a low potential side connected to the second power line;

a second circuit block including a power node on a high potential side is connected to the third power line and a power node on a low potential side connected to the fourth power line; and a logic circuit including an input connected to an output node of the first circuit block and an output node connected to an input node of the second circuit block, wherein the logic circuit, in the first state, dynamically supplies the input node of the second circuit block with a signal of the logical high level via the third power line or a signal of the logical low level via the second power line, or, dynamically supplies the input node of the second circuit block with a signal of the logical high level via the first power line or a signal of the logical low level via the fourth power line, based on an output signal output from the output node of the first circuit block, and the logic circuit, in the second state, fixedly supplies the input node of the second circuit block with the signal of the logical high level via the third power line, or fixedly supplies to the input node of the second circuit block with the signal of the logical low level via the fourth power line based on an output signal output from the output node of the first circuit block.

18. The semiconductor device as claimed in claim 17, wherein the logic circuit includes first and second conductivity type transistors having gates commonly supplied with the output signal of the first circuit block, the first and second conductivity type transistors being serially connected in between the first and fourth power lines, the output signal output from the output node of the first circuit block is fixed at the logical high level in the second state, the first conductivity type transistor becomes electrically conducting when the output signal output from the output node of the logic circuit is in the logical high level, and the second conductivity type transistor becomes electrically conducting when the output signal output from the output node of the logic circuit is in the logical low level.

19. The semiconductor device as claimed in claim 17, wherein the logic circuit includes first and second conductivity type transistors having gates commonly supplied with the output signal of the first circuit block, the first and second conductivity type transistors being serially connected in between the third and second power lines, the output signal output from the output node of the first circuit block is fixed at the logical low level in the second state, the first conductivity type transistor becomes electrically conducting when the output signal output from the output node of the logic circuit is in the logical high level, and the second conductivity type transistor becomes electrically conducting when the output signal output from the output node of the logic circuit is in the logical low level.

20. The semiconductor device as claimed in claim 17, wherein a threshold voltage of a transistor included in the first circuit block is lower than a threshold voltage of a transistor included in the second circuit block.

21. The semiconductor device as claimed in claim 20, wherein a threshold voltage of a transistor included in the logic circuit is lower than the threshold voltage of the transistor included in the second circuit block.

22. The semiconductor device as claimed in claim 17, wherein
the first off-leakage control circuit includes a first switch circuit connected between the first and third power lines,
the second off-leakage control circuit includes a second switch circuit connected between the second and fourth power lines,
both the first and second switch circuits are in an electrical conductive state in the first state, and
both the first and second switch circuits are in an electrical non-conductive state in the second state.

23. The semiconductor device as claimed in claim 22, wherein
the first off-leakage control circuit further includes a first regulator circuit that supplies the first power line with a first potential in the second state,
the second off-leakage control circuit further includes a second regulator circuit that supplies the second power line with a second potential in the second state,
the first regulator circuit controls the first potential based on a predetermined electric potential applied to its own input node, and
the second regulator circuit controls the second potential based on a predetermined electric potential applied to its own input node.

24. The semiconductor device as claimed in claim 22, wherein
the first off-leakage control circuit further includes a first transistor switch having a source connected to the first power line, a drain connected to the third power line, and a gate supplied with a first control potential,
the second off-leakage control circuit further includes a second transistor switch having a source connected to the second power line, a drain connected to the fourth power line, and a gate supplied with a second control potential, and
an electric potential of the first power line and an electric potential of the second power line are controlled based on the first and second control potentials, respectively.

25. A data processing system comprising:
a semiconductor device;
a controller that supplies a command to the semiconductor device, wherein
the semiconductor device enters in a first state or a second state based on the command,
the semiconductor device comprises:
a first power line of high potential side and a second power line of low potential side that are power gated;
a third power line of high potential side and a fourth power line of low potential side that are not power gated; and
first to third logic circuits each including an input node to receive an input signal and an output node to output an output signal, wherein
the first logic circuit is connected to the first power line and the second power line,
the second logic circuit is connected to the first and fourth power lines or the third and second power lines,
the third logic circuit is connected to the third power line and the fourth power line,
the output node of the first logic circuit is connected to the input node of the second logic circuit,
the output node of the second logic circuit is connected to the input node of the third logic circuit,
in the first state, an electric potential of the first power line and an electric potential of the second power line are equal to an electric potential of the third power line and an electric potential of the fourth power line, respectively, and
in the second state, the electric potential of the first power line is lower than the electric potential of the third power line, the electric potential of the second power line is higher than the electric potential of the fourth power line, and the electric potential of the first power line is higher than the electric potential of the second power line.

26. A data processing system comprising:
a semiconductor device; and
a controller that supplies a command to the semiconductor device, wherein
the semiconductor device enters in a first state or a second state based on the command,
the semiconductor device comprises:
first and third power lines supplied with an electric potential showing a logical high level, respectively;
second and fourth power lines supplied with an electric potential showing a logical low level, respectively;
a first off-leakage control circuit that supplies the first power line with an electric potential that is same as an electric potential of the third power line in the first state, and supplies the first power line with an electric potential that is lower than the electric potential of the third power line in the second state;
a second off-leakage control circuit that supplies the second power line with an electric potential that is same as an electric potential of the fourth power line in the first state, and supplies the second power line with an electric potential that is higher than the electric potential of the fourth power line in the second state;
a first circuit block including a power node on a high potential side connected to the first power line and a power node on a low potential side connected to the second power line;
a second circuit block including a power node on a high potential side is connected to the third power line and a power node on a low potential side connected to the fourth power line; and
a logic circuit including an input connected to an output node of the first circuit block and an output node connected to an input node of the second circuit block, wherein
the logic circuit, in the first state, dynamically supplies the input node of the second circuit block with a signal of the logical high level via the third power line or a signal of the logical low level via the second power line, or, dynamically supplies the input node of the second circuit block with a signal of the logical high level via the first power line or a signal of the logical low level via the fourth power line, based on an output signal output from the output node of the first circuit block, and the logic circuit, in the second state, fixedly supplies the input node of the second circuit block with the signal of the logical high level via the third power line, or fixedly supplies to the input node of the second circuit block with the signal of the logical low level via the fourth power line based on an output signal output from the output node of the first circuit block.

* * * * *